United States Patent
Current

[19]

[11] Patent Number: 5,155,369
[45] Date of Patent: Oct. 13, 1992

[54] MULTIPLE ANGLE IMPLANTS FOR SHALLOW IMPLANT

[75] Inventor: Michael Current, Kyoto, Japan

[73] Assignee: Applied Materials, Inc., Santa Clara, Calif.

[21] Appl. No.: 590,193

[22] Filed: Sep. 28, 1990

[51] Int. Cl.[5] .......................................... H01J 37/00
[52] U.S. Cl. ................................... 250/492.2; 437/35
[58] Field of Search ..................... 250/492.21; 437/27, 437/35, 44

[56] References Cited

U.S. PATENT DOCUMENTS

| | | | |
|---|---|---|---|
| 3,615,875 | 10/1971 | Morita et al. | 437/35 |
| 4,404,233 | 9/1983 | Ikeda et al. | 437/35 |
| 4,587,432 | 3/1986 | Aitken | 250/492.2 |
| 4,771,012 | 9/1988 | Yabu et al. | 437/35 |
| 4,794,305 | 12/1988 | Matsukawa | 250/492.21 |
| 4,889,820 | 12/1989 | Mori | 437/35 |
| 4,942,138 | 7/1990 | Miki | 437/35 |
| 4,977,099 | 12/1990 | Kotaki | 437/44 |

FOREIGN PATENT DOCUMENTS

| | | | |
|---|---|---|---|
| 102669 | 9/1978 | Japan | 437/35 |
| 144175 | 8/1984 | Japan | 437/35 |

OTHER PUBLICATIONS

"Silicon Processing for the VLSI Era", Wolf et al., Lattice Press, 1989, pp. 292-294.
Michael Current et al., "Planar Channeling Effects in Si(100)", Nuclear Instruments and Methods in Physics Research B6 (1985), 336-348.
FIG. 1 from a Ph.D. Dissertation by Kevin Scott Jones.

Primary Examiner—Bruce C. Anderson
Attorney, Agent, or Firm—John A. Frazzini

[57] ABSTRACT

An implantation process in which a first dose of ions is implanted to produce a damaged layer through which a second dose of implant ions is directed. The damaged layer scatters the ions in the second dose so that these latter ions need not be directed at an angle to avoid channeling. The second dose is generally significantly higher than the first so that the resulting doping profile is produced primarily by the second dose, which can be directed perpendicular to the surface of the wafer.

12 Claims, 4 Drawing Sheets

MULTIPLE ANGLE IMPLANTS FOR SHALLOW IMPLANT

BACKGROUND OF THE INVENTION

This invention relates in general to ion implantation processes and relates more particularly to an implantation process that enables the production of symmetrical MOS transistor junctions.

In the figures, each element indicated by a reference numeral will be indicated by the same reference numeral in every figure in which that element appears. The first two digits of any four digit reference numerals and the first digit of any two or three digit reference numerals indicates the first figure in which its associated element is presented.

In ion implantation processes, the depth of implantation of implanted ions increases greatly if the direction of implantation is along a major crystal symmetry direction (see, for example, Michael I. Current, et al, *Planar Channeling Effects in Si*(100), Nuclear Instruments and Methods in Physics Research B6(1985), 336-348). Thus, junction depth of implanted junctions can vary greatly if the implantation direction is nearly parallel to a major crystal symmetry direction. Channeling effects are commonly reduced by directing the implantation beam along a direction between 7 and 10 degrees away from the major crystal axis which is usually coincident with the perpendicular direction to the wafer top surface. The selected angle of implantation depends on the choice of ion, the implantation energy and the crystal orientation. Unfortunately, such tilt of the implantation beam away from the direction perpendicular to the top surface 19 of the wafer introduces an asymmetry into the implantation process. For example, in the production of MOS transistor junctions, this asymmetry in the implantation process produces an asymmetry between the MOS source and drain regions.

This asymmetry is illustrated in FIG. 1. In that figure, gate 11 and field oxide regions 12 and 13 have already been formed on a substrate 14 before the implantation step illustrated in this figure is commenced. Gate 11 typically consists of an oxide layer of thickness on the order of 100 Angstroms on top of which is a polysilicon layer of thickness on the order of 3,000-5,000 Angstroms. The implant ions are directed along a direction D that is at an angle A on the order of 7-10 degrees from the perpendicular N to the substrate to surface 19. In comparison to an implantation along the direction N, when the ions are implanted along the direction D, ions are blocked from being implanted in region 15 and are allowed to be implanted into region 16. Because of this asymmetry, source region 17 is not symmetric with drain region 18. Thus, the benefits of greatly reduced channeling are achieved at the cost of asymmetric junctions.

There are two common techniques for achieving symmetric junctions while avoiding the channeling problems that generally occur when the ions are implanted along the direction N. In the first of these methods, illustrated in FIGS. 2 and 3, the implantation process occurs in two steps.

In the first step, illustrated in FIG. 2, some nondopant ions are implanted along the direction N into a substrate 24 to a dept at least as great as the selected implantation depth for the dopant ion implantation step. Typically, ions of energy 5,000-180,000 ev are implanted to a depth of 2,000-10,000 Angstroms. This produces implanted regions 27 and 28 that are not only symmetric with respect to a gate 11, but are also substantially amorphous. That is, this first step has produced amorphous regions 27 and 28 that do not have the crystal pattern that results in the channeling effect. Therefore, dopant ions can be implanted along the normal direction N without experiencing the effects of channeling. Thus, in the second step, also illustrated in FIG. 2, dopant ions are implanted along the direction N. Because the ions are implanted along the direction N, the source and drain regions 27 and 28, respectively, are symmetric with respect to the gate 11. Because of the lack of crystal symmetry directions, the dopant ion concentration exhibits a sharply peaked profile as a function of implantation depth and does not include a channeling tail as would occur if regions 27 and 28 were crystalline.

In the second of the two above-mentioned methods for producing symmetric junctions without channeling effects, instead of producing deep (on the order of 10,000 Angstroms) amorphous regions in the substrate by a deep implantation of nondopant ions, only thin amorphous layers are produced at the top surface 19 of substrate 14. In a first variant of this method, illustrated in FIG. 3, thin amorphous regions, such as thermal oxide or CVD oxide, are formed on the top surface 19. As is discussed in the above-mentioned paper by Michael Current, an oxide layer on the order of or greater than 200 Angstroms is needed to substantially eliminate channeling. Dopant ions are then implanted along the normal direction N to produce symmetric source and drain regions 37 and 38, respectively.

In a second variant of this method, illustrated in FIG. 4, the thin amorphous regions 31 and 32 are produced by low energy implantation of the substrate with nondopant ions directed at an angle on the order of 7-10 degrees away from the normal N. The production of amorphous regions 31 and 32 is again followed by a high energy dopant ion implantation step along the normal direction N to produce symmetric source and drain regions 37 and 38. Because this layer is thin, the asymmetry of this process does not result in a significant asymmetry between the resulting thin amorphous regions 31 and 32.

In each of these variants of this method, the amorphous regions have a thickness T that is thick enough to scatter the incident dopant ions sufficiently that only a small fraction of these dopant ions can be along any given crystal lattice symmetry direction. This substantially reduces, but does not eliminate, the channeling problem. The thickness T should be thin enough that multiple scatterings within the amorphous regions do not so reduce the normal component of implantation ion velocity within the substrate that inordinately high implantation energies are required for conventional implantation depths. Thicknesses T on the order of 2,000-10,000 Angstroms are typical.

Unfortunately, both variants of producing the thin amorphous regions 31 and 32 require extra processing steps that significantly increase the production costs. Because different ions are used in the production of amorphous regions 31 and 32 than are used in the implantation of the dopants, the beam analyzing system (see, for example, U.S. Pat. No. 4,587,432 entitled *Apparatus For Ion Implantation* issued to Derek Aitkens on May. 6, 1986) used to select the ions for use in implantation into the substrate has to be tuned to select the ions utilized for the amorphization step and then needs to be retuned for the dopant implantation step to select the desired ions for the doping implantation step. If the ions for implantation are generated by a plasma ionization process, then the steps of tuning the plasma for the different implant ions can take as long as about an hour, thereby significantly increasing process time.

Gas flow rates and oven temperatures may also need to be altered between these two implantation steps. Depending on the ions utilized in each of these steps, the implantation chamber may need to be purged between these two implantation steps, thereby contributing additional time to this implantation process. Also, these amorphization steps can introduce impurities that reduce the operating efficiency of the resulting device. The ions used to produce the amorphous regions must have a high purity to avoid contaminating the substrate. This also increases the cost of manufacture.

When an oxide layer is produced on the surface 19 as amorphous regions 31 and 32, the subsequent dopant implantation step can drive some of the oxygen atoms into the substrate. This can produce defects in the source and drain regions that must be eliminated by an additional annealing step. The oxygen that is driven into the substrate can also result in the production of poor electrical contact of these source and drain regions with associated conductive contacts. Furthermore, when oxide amorphous regions 31 and 32 are formed, these regions must be stripped before contacts can be formed with the source and drain regions, thereby adding a further step to this integrated circuit manufacturing process.

SUMMARY OF THE INVENTION

In accordance with the illustrated preferred embodiment, dopant ions are implanted in a two step process. In the first step, a light dose of dopant ions is implanted at an angle on the order of 5-7 degrees away from the normal N to the top surface of a substrate. The dose is selected to produce sufficient damage to the implanted regions that the crystal lattice is highly damaged in these implanted regions. If this dose is large enough, a phase transition from a damaged crystalline lattice state to an amorphous state within the implanted regions can result. However, it is not necessary to produce an amorphous state in these implanted regions. All that is needed is that sufficient damage to the crystal lattice result in these implanted regions that, in a subsequent implant step, this implant region produces sufficient scatter of the incident implant ions that only a small fraction of these latter implant ions can travel through the substrate along one of the major crystal symmetry directions.

The subsequent implant step is at a much larger dopant dosage and is directed along the normal N to the top surface of the substrate. Because the dosage is much larger than in the first implant step and because this step utilizes an implant direction normal to the top surface of the substrate, the resulting source and drain regions are substantially symmetric with respect to the gate region. Although this discussion has been in terms of source and drain regions, this two step process is also applicable to other structures in which it is desired that the resulting implanted regions have side boundaries that are substantially perpendicular to the top surface of the substrate.

In a first variant of this method, the implantation energy of the first implant step is larger than in the second implant step so that the regions damaged by the first step are at least as deep as the implantation depth of the ions implanted in the heavier second implantation step. In this variant, scatter of the ions in the second implantation step occurs throughout the implant trajectory of these latter implant ions.

In a second variant of this method, the implantation energy is much smaller in the first implantation step than in the second implantation step. This results in a surface scattering layer that must have a conbination of thickness and damage per unit volume such that substantially all of the ions in the second implantation step are scattered as they pass through this implanted layer. In general, this requires a lower concentration of dopant in this first step than is required in the first step in the first variant of this method. However, because the implanted layer produced by the first implant step is thin, the asymmetry of the first implant step does not produce a significant asymmetry of the resulting implanted regions.

The scattering of the ions in the first implantation step somewhat reduces the expected asymmetry in the resulting implanted regions because of the lateral velocity component of the scattered implanted ions. This scattering of the ions of the first implant step introduces random lateral components to their velocities, thereby enabling a portion of these to scatter into shadow regions of features (such as a gate) on the top surface of the substrate. These lateral velocities enable these scattered ions to partially fill in the asymmetric shadow regions, thereby reducing the amount of asymmetry. This scattering effect is referred to as "straggling". The amount of straggling need only produce a significant amount of damage in these shadowed regions and need not produce an equal amount of damage as in the nonshadowed regions. The energy, dopant implantation concentration and implantation angle can all be adjusted to enhance straggling.

In addition to selecting separately the dopant dosage and implant energies of the two steps of this implantation process, the choice of dopants can differ in these two steps. In general, it is advantageous to select a heavier dopant ion for the first implant step than for the second implant step to enhance the amount of damage to the lattice produced by the first implantation step. Because the damage is produced by elastic scattering of the implant ions off of substrate atoms, the amount of damage to the lattice is a function of the incident momentum of the implant particles as well as their implant energy. Basic scattering theory shows that if two different particles have the same energy but different momenta, then the more massive incident implant ion will produce a greater amount of damage to the substrate.

In another embodiment of this process, the first implantation step can be broken into a pair of substeps. In the first of these substeps, the ions are incident at an angle A with respect to the normal. In the second of these substeps, the ions are incident at an angle $-A$ with respect to the normal to the top surface of the wafer. Therefore, the combination of these two substeps produces a symmetric process. For a wafer implant apparatus in which the implant angle can be varied through both positive and negative angles, these two angles can be achieved solely by tilting the implantation apparatus.

For a wafer implant apparatus in which the implant angle can only be varied through positive angles, this symmetry is achieved by rotating the wafer by 180 degrees about the normal N to its top surface before the second substep of implantation is executed.

This process has several advantages over the previous implantation processes discussed in the Background of the Invention. Because the same ion can be used in both the first and second implantation steps, it is possible to avoid retuning of the implantation apparatus to handle different ions in these two implantation steps. Thus, this process will avoid the extra time required in those prior processes to tune and then retune the implantation apparatus to handle more than one implant ion. It will avoid the delays associated with purging between steps utilizing different process gases. It will also avoid the need to utilize an additional high purity dopant source as is required in the prior processes of producing a thin oxide layer to scatter the dopant ions.

These and other advantages of the present invention will become clear from the detailed description given below in which a preferred embodiment is described in relation to the drawings. The detailed description is presented to illustrate the present invention, but is not intended to limit it.

DESCRIPTION OF THE PREFERRED EMBODIMENT

Figure 1:
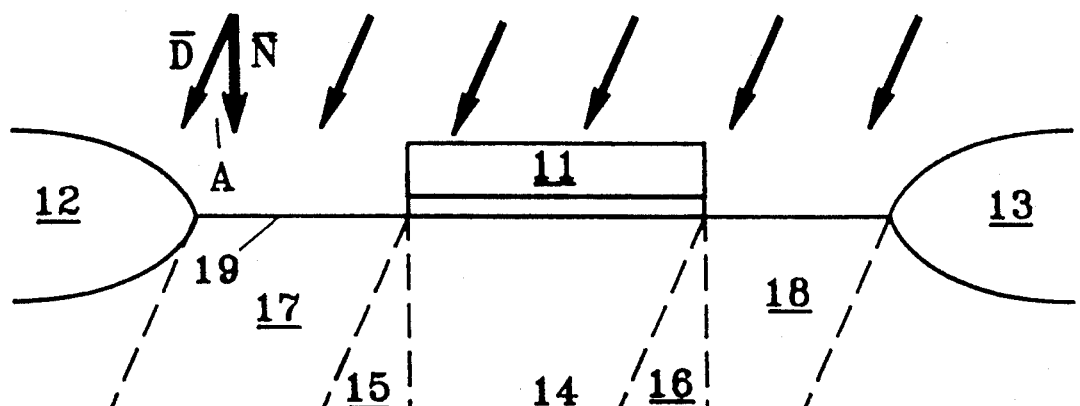
FIG. 1 illustrates the asymmetry of source and drain regions that can result if these regions are produced by ions that are incident along a direction different from the normal N to the top surface of the substrate.
Figure 2:
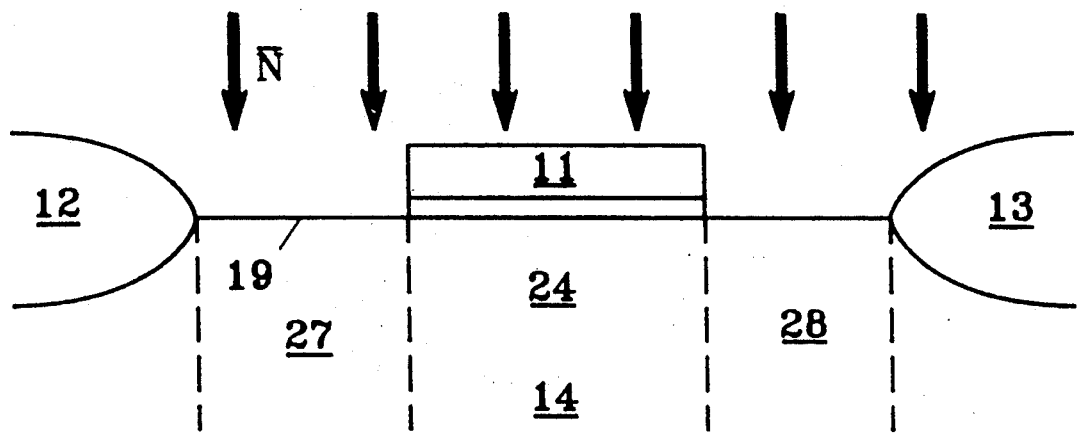
FIG. 2 illustrates a prior method in which a deep amorphous region is produced before dopant ions are directed at the wafer along the direction of the normal N to the top surface of the substrate.
Figure 3:
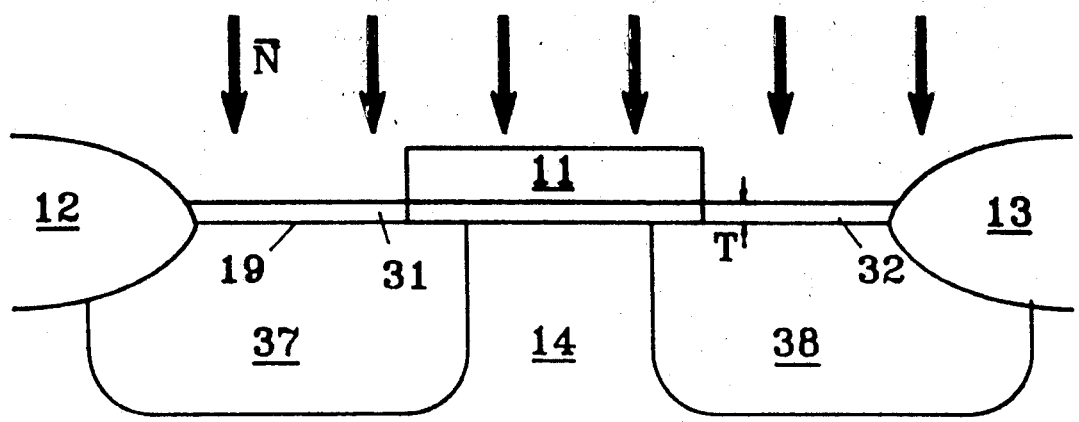
FIG. 3 illustrates a prior method in which a thin scattering layer is grown on the top surface of the substrate to scatter a subsequent beam of normally incident dopant implant ions so that only a small fraction of these dopant ions will be directed along any of the major crystal symmetry directions of the substrate.
Figure 4:
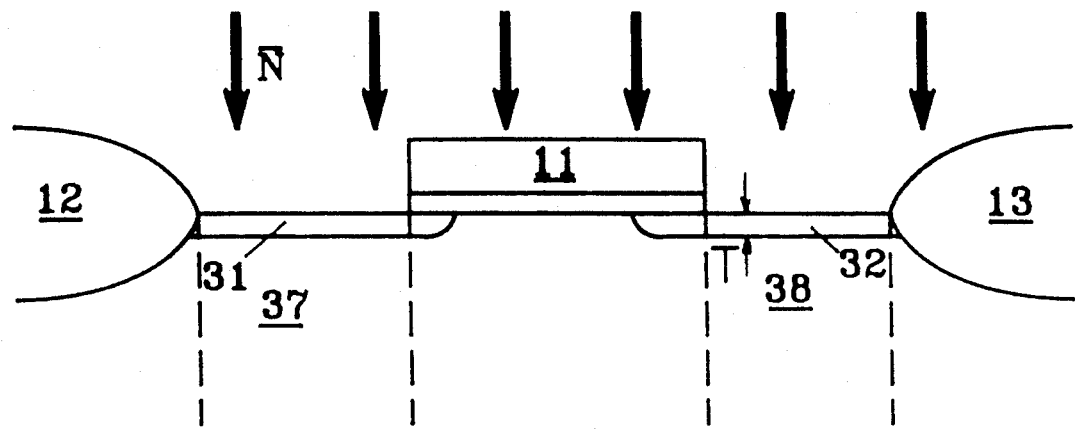
FIG. 4 illustrates a prior method in which a thin scattering layer is implanted through the top surface of the substrate to scatter a subsequent beam of normally incident dopant implant ions so that only a small fraction of these dopant ions will be directed along any of the major crystal symmetry directions of the substrate.
Figure 5A:
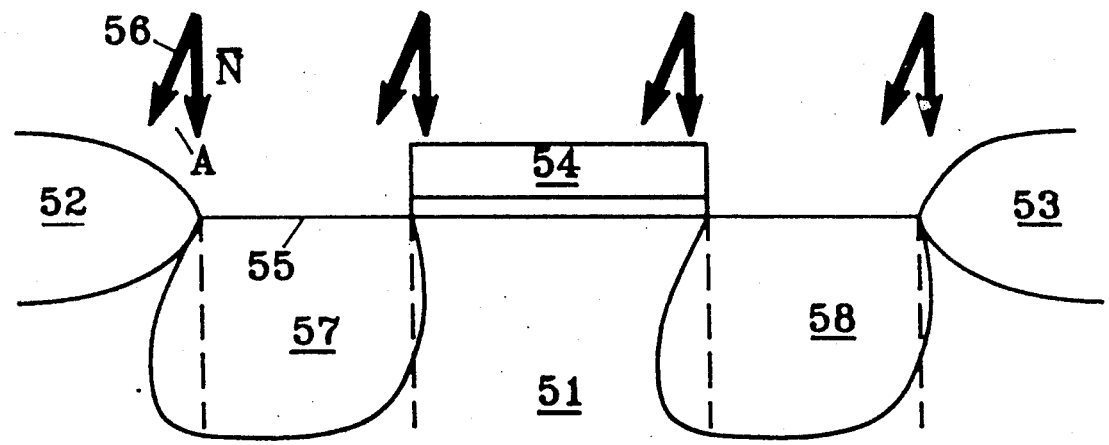
FIG. 5A illustrates a high energy, low concentration dopant implantation step to produce a scattering region into which a higher concentration of the same dopant can be implanted.
Figure 5B:
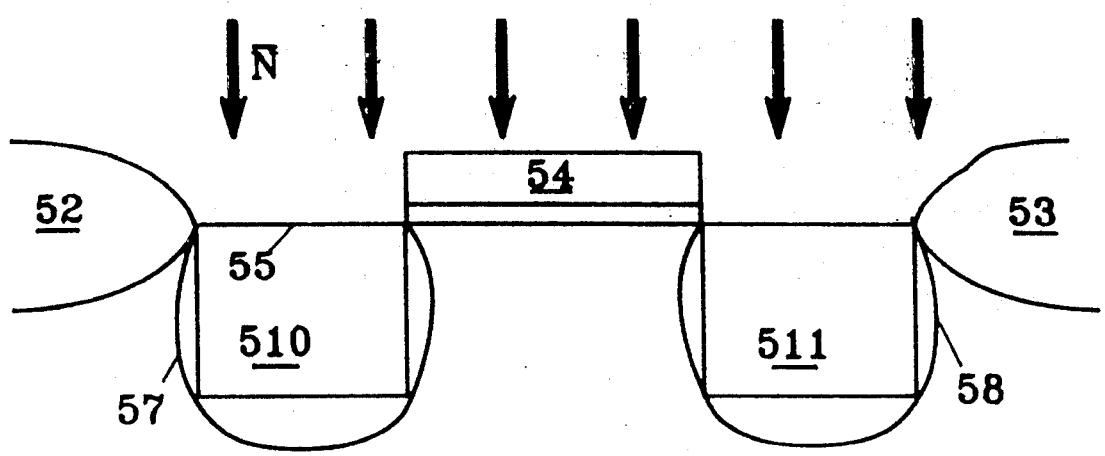
FIG. 5B illustrates the implantation of the higher concentration of dopant implant ions into the substrate.
Figure 5C:
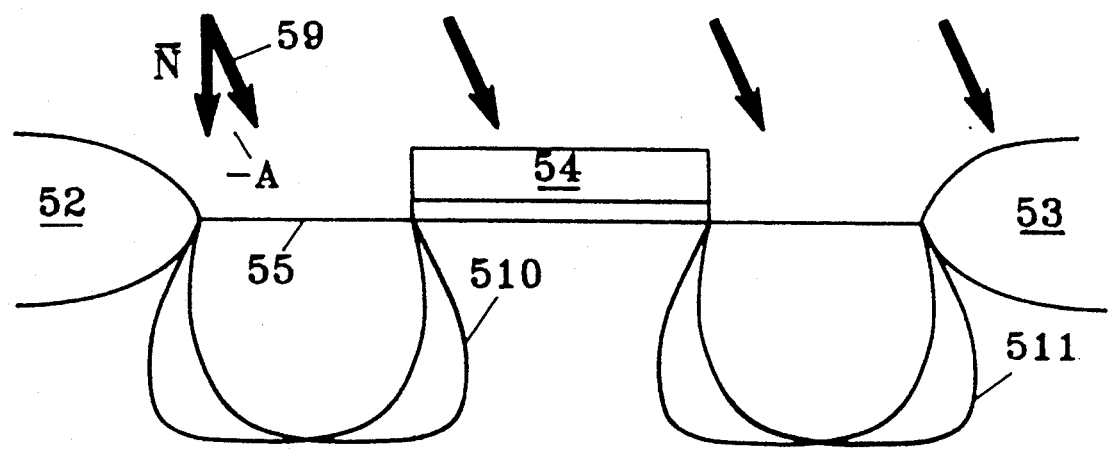
FIG. 5C illustrates an optional additional step of asymmetric implantation at an opposite direction of implant to that in FIG. 5A to produce a symmetric implantation process.

FIGS. 5A and 5B illustrate a new dopant implantation process for the particular case of a substrate 51 on which have already been formed a pair of field oxide regions 52 and 53 and a gate 54. However, this two step process is applicable in any application in which it is desired to avoid channeling effects and to produce implant regions that extend into the substrate substantially perpendicular to a top surface 55 of the substrate.

In a first step, illustrated in FIG. 5A, a high energy beam 56 of dopant ions is directed at substrate 51 along a direction that forms an angle A with a normal N to the top surface 55 of the substrate. The angle A is selected to avoid significant channeling effects and is typically selected in the range 5-10 degrees. The range from 5-7 degrees has been found to be particularly advantageous in this process. The ability to implant at nonzero angles A is not inherent in all implantation apparatus. However, there are a number of commercially available implantation devices, such as the Precision Implant 9200 from Applied Materials, Inc., that enable the angle A to be varied over a limited range. In this particular device, the angle can be varied over the range 0 to 7 degrees.

The implantation energy is on the order of 50 keV. The flux intensity and duration of implantation are selected to produce a dopant flux on the order of $10^{14}$–$10^{15}$/cm$^2$. This implantation produces a pair of implanted regions 57 and 58 through which the ion beam penetrates into the substrate. The ion flux is selected sufficiently large so that a sufficient number of defects are produced within implanted regions 57 and 58 that a subsequent flux of ions along the direction N perpendicular to the top surface 55 of the substrate will be sufficiently scattered that channeling effects are not important.

In a second step, illustrated in FIG. 5B, a beam 59 of dopant ions is directed substantially along the direction N perpendicular to top surface 55. These ions are implanted at an energy on the order of 20 keV and at a total beam flux density of 3–5×$10^{15}$/cm$^2$. This produces a pair of implant regions 510 and 511 having sidewalls that are substantially parallel to the perpendicular direction N.

Because of straggling effects during the formation of implanted region 57, some damage to the substrate is produced in the region 512 that is shadowed by gate 54 from direct penetration of implant ions. Therefore, even for ions implanted in the second step through the region of top surface 55 adjacent to gate 54, these ions will pass through the region 512 that contains damage due to straggling effects. Therefore, even these implant ions will experience some scattering that significantly reduces channeling effects for such dopant implant ions. Thus, channeling effects are substantially eliminated during this second implant step even though these ions are directed perpendicular to the top surface of the substrate.

Because the implant concentration from the second implantation step is on the order of 5-50 times greater than that from the first implantation step, the dopant concentration profile is determined primarily by the dopant concentration profile of the ions implanted during the second of these implantation steps. Because of this, the total dopant concentration profile is substantially symmetric with respect to gate region 54 and has sidewalls that are substantially perpendicular to top surface 55.

After the second implantation step, the substrate is annealed to remove the damage introduced by the implantation step. This temperature during annealing is typically in the range of 900-1100 degrees Centigrade. Common variants of the annealing step include a furnace anneal that requires about 15-30 minutes at the elevated annealing temperature. An increasingly popular type of annealing step is the rapid thermal anneal in which the temperature of the substrate is elevated to the desired temperature by exposing the wafer to an energy flux on the order of 1 Joule per square centimeter. This anneal can be completed in 1-30 seconds and is advantageous because the reduced time also reduces dopant ion diffusion.

Figure 6A:
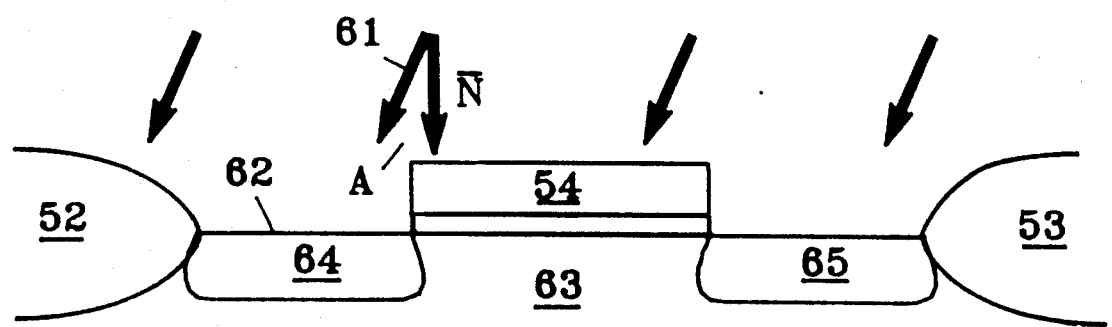
FIG. 6A illustrates a low energy, low concentration dopant implantation step to produce a thin scattering layer near the top surface of the substrate to scatter dopants implanted in a subsequent higher concentration, higher energy implantation step.

In the particular method illustrated in FIGS. 5A and 5B, the implantation depth in the first dopant implantation step is greater than that in the second step so that the dopant ions implanted during the second step experience scattering throughout their trajectories. However, in an alternate embodiment of this invention, the first dopant implantation step can implant dopant ions to a depth less than that of the ions implanted during the second implantation step, as long as the amount of substrate lattice damage produced in the first implantation step is sufficiently large that only a small fraction of the ions in the second implantation step pass through the implanted region without scattering. This implantation process is illustrated in FIGS. 6A and 6B.

Figure 6B:
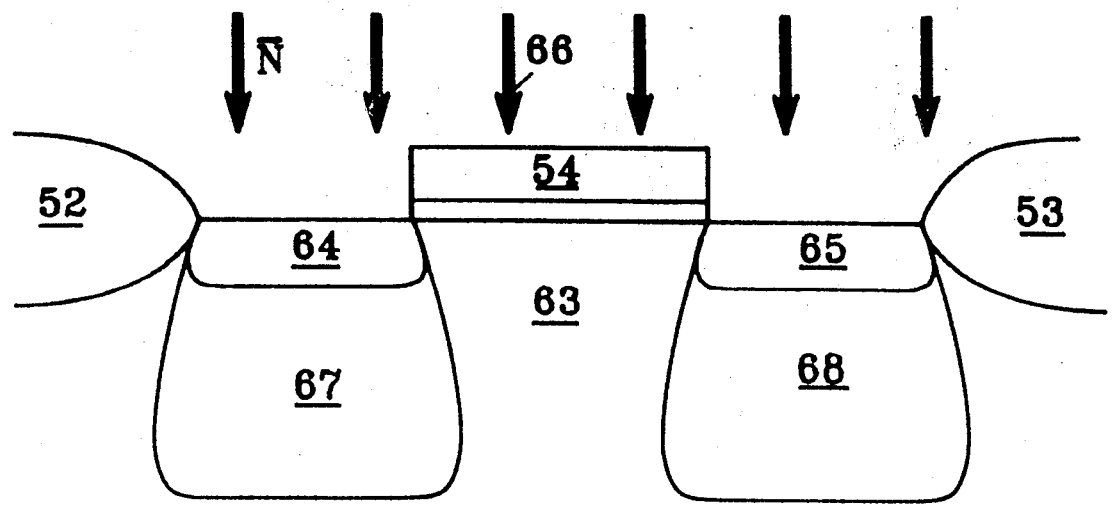
FIG. 6B illustrates the implantation of the higher concentration, higher energy dopants into the substrate.

In the first implantation step, illustrated in FIG. 6B, a beam 61 of dopant ions is implanted at an angle A with respect to a normal N to a top surface 62 of a substrate 63. The angle A is selected to avoid significant channeling and is typically selected within the range 5-10 degrees. This implantation step produces a pair of implant regions 64 and 65. The implantation energy is on the order of 20 keV so that ions are implanted to a maximum depth on the order of 500 Angstroms. The flux density of dopant implant ions is on the order of $10^{14}$-$10^{15}$ ions per cm$^2$ and produces sufficient damage that a subsequent perpendicular implantation through implanted regions 64 and 65 does not exhibit significant channeling effects. Because this layer is thin, the asymmetry of this implantation process produces dopant regions 64 and 65 having only a small amount of asymmetry and, more particularly, has less asymmetry than the implant regions 57 and 58 of FIGS. 5A and 5B.

In a second implantation step illustrated in FIG. 6B, a beam 66 of dopant ions is incident along the direction N perpendicular to the top surface 62 of the substrate. The energy is selected to produce the desired implantation depth into a pair of regions 67 and 68 and is dependent on the particular choice of dopant implant ions. Similarly, the concentration is determined by the desired concentration of the implanted region and will vary with the particular application. In general, the density of implantation into layers 64 and 65 is higher than the density of implantation into layers 57 and 58, but the total dopant dosage is greater in implantation layers 57 and 58 than in layers 64 and 65.

In all of these embodiments of this process, dopant ions are utilized in both the first and second implantation steps. However, it is not necessary that the identical dopant elements be used in both implantation steps. In particular, in the first dopant step in which it is desirable to introduce damage to the wafer lattice, it is desirable to utilize heavy dopant ions. For this reason, it is desirable to utilize dopant ions of at least 17 Atomic Mass Units for the first implantation step. Some choices for the first and second implantation steps are:

| First Implantation Step | Second Implantation Step |
|---|---|
| BF$_2^-$ or F$^-$ | BF$_2^-$ or B$^-$ |
| As$^-$ or As$_2^-$ | As$^-$ |
| P$_2^-$ | P$^-$ |

It is advantageous to keep the amount of implanted fluorine low to avoid formation of fluorine bubbles in the substrate. It has been found that, for production of implant layers 64 and 65, that the energies E for the various choices of implant ion should be:

B:E<10 keV

BF$_2$:E<50 keV

As:E<20 keV

P:E<15 keV

Figure 7:
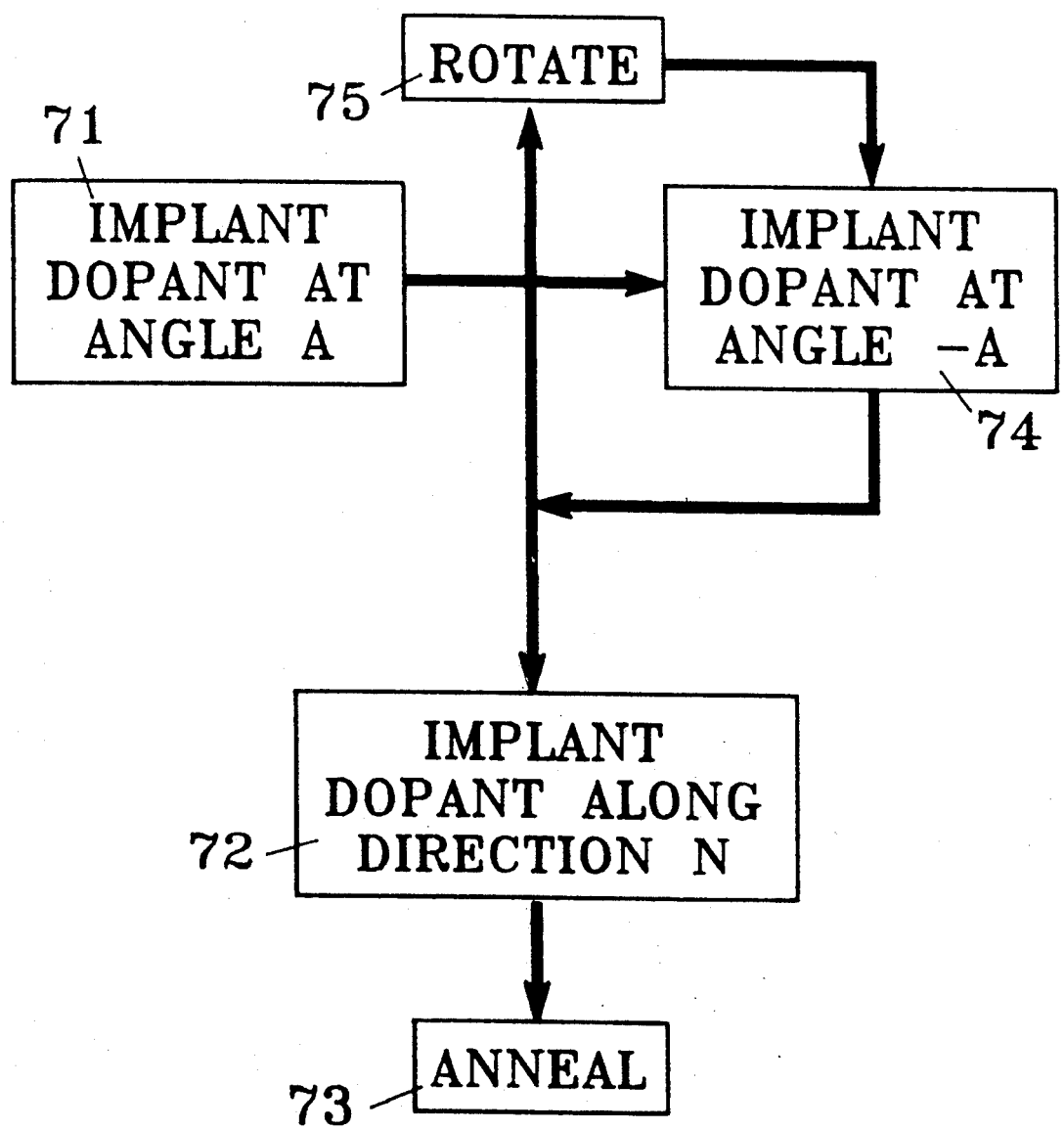
FIG. 7 is a flow diagram of the processes of FIGS. 5A, 5B, 5C, 6A and 6B.

FIG. 7 is a block diagram of the implantation process illustrated in FIGS. 5A, 5B, 5C, 6A and 6B. In a first implantation step 71, dopant ions are implanted at an angle A from the direction N perpendicular to the top surface of the substrate. In a subsequent dopant implantation step 72, a much heavier dose of dopant ions is implanted substantially perpendicular to the top surface of the substrate. The wafer is then subjected to an annealing step to eliminate the defects introduced by the implantation steps.

Because of residual asymmetry of this process introduced by step 71, it is advantageous to introduce an additional implantation step 74 in which dopant ions of substantially the same energy, concentration and dopant selection are implanted at an angle −A from the normal N, thereby producing symmetric implanted regions. In some systems, such as the Precision Implant 9200 from Applied Materials, Inc., the angle of implant cannot be set to negative angles. In such cases, between a first step 71 of implantation at angle A and an additional step 74 of implantation at angle −A, the wafers can be rotated by 180 degrees (step 75) about the direction N that is perpendicular to a top surface of the wafer. This could be achieved by means of a robot that removes the wafer from the processing wheel on which it is mounted for implantation, rotates it by 180 degrees about N and then reinserts such wafer back onto this wheel for the additional implantation step.

The foregoing detailed description is illustrative of the invention and it is to be understood that additional embodiments thereof will be obvious to those skilled in the art. This description, together with those additional embodiments obvious to those skilled in the art, are considered to be within the scope of the invention.

I claim:

1. A method of ion implantation comprising the steps of:
    (a) implanting a dopant ion into a substrate along a direction D forming an oblique angle A with respect to a perpendicular direction N to a top surface of the substrate to produce at least one damaged region that is sufficiently damaged that a subsequent implant of ions will experience only negligible channeling, wherein the angle A is selected such that these ions do not exhibit a significant amount of channeling; and, after step (a)
    (b) implanting a dopant ion into at least one of said damaged regions of the substrate along a direction substantially parallel to the direction N, whereby substantially symmetric implanted regions that are substantially free of channeling effects can be produced.

2. A method as in claim 1 wherein the concentration of dopant ions produced by step (b) is much greater than the dopant concentration produced by step (a), whereby a resulting dopant concentration distribution is substantially symmetric with respect to the perpendicular direction N.

3. A method as in claim 1 wherein the same dopant ion is utilized in steps (a) and (b).

4. A method as in claim 1 wherein a heavier dopant ion is utilized in step (a) than is utilized in step (b).

5. A method as in claim 1 wherein the dopant ions in step (a) each has a mass of at least 17 atomic mass units.

6. A method as in claim 1 wherein the implantation ions in step (a) are implanted to a greater implantation depth than in step (b), whereby the dopant ions implanted in step (b) are scattered throughout their trajectory into the substrate.

7. A method as in claim 6 wherein the ions implanted in step (a) are implanted to a depth in the range 0.1–0.2 microns.

8. A method as in claim 1 wherein the dopant ions in step (a) produce a surface damage layer.

9. A method as in claim 8 wherein the ions in step (a) are implanted to a depth in the range 100–300 Angstroms.

10. A method as in claim 8 wherein a choice of dopant ion and implantation energy in step (a) is selected from the set consisting of:
   (i) boron at an implant energy less than 10 keV;
   (ii) $BF_2$ at an implant energy less than 50 keV;
   (iii) arsenic at an implant energy less than 20 keV; and
   (iv) phosphorous at an implant energy less than 15 keV.

11. A method as in claim 1 wherein, in step (a), angle A is in the range of 5–10 degrees.

12. A method as in claim 1 wherein said damaged region is sufficiently damaged that it is amorphous.

* * * * *